United States Patent
Tseng et al.

(10) Patent No.: US 7,576,557 B1
(45) Date of Patent: Aug. 18, 2009

(54) METHOD AND APPARATUS FOR MITIGATING ONE OR MORE EVENT UPSETS

(75) Inventors: Chen Wei Tseng, Longmont, CO (US); Carl H. Carmichael, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/056,207

(22) Filed: Mar. 26, 2008

(51) Int. Cl.
*H03K 19/003* (2006.01)
(52) U.S. Cl. .................... 326/9; 326/14; 326/38
(58) Field of Classification Search ......... 326/9–10, 326/14–16, 38–41
See application file for complete search history.

(56) References Cited

U.S. PATENT DOCUMENTS

| | | | |
|---|---|---|---|
| 6,101,624 A * | 8/2000 | Cheng et al. | 714/736 |
| 7,236,000 B1 | 6/2007 | Steiner | |
| 7,283,409 B1 | 10/2007 | Voogel et al. | |
| 7,310,759 B1 | 12/2007 | Carmichael et al. | |
| 2007/0176627 A1 * | 8/2007 | Ng et al. | 326/14 |

OTHER PUBLICATIONS

U.S. Appl. No. 12/038,768, filed Feb. 27, 2008, Tseng, Chen Wei et al., entitled "Method and Apparatus for Configuring an Integrated Circuit", Xilinx, Inc. 2100 Logic Drive, San Jose, CA 95124.
U.S. Appl. No. 11/388,897, filed Mar. 24, 2006, Carmichael, Carl H., et al., "Techniques for Mitigating Detecting, and Correcting Single Event Upset Effects in Systems Using SRAM-Based Field Programmable Gate Arrays", Xilinx, Inc. 2100 Logic Drive, San Jose, CA 95124.
U.S. Appl. No. 11/158,864, filed Jun. 22, 2005, Jones, IV, Leslie W., et al., entitled "High-Speed Detection and Correction of Soft Errors in a Configuration Memory", Xilinx, Inc. 2100 Logic Drive, San Jose, CA 95124.
XAPP 714 (v1.0), "Single Event Upset (SEU) Detection and correction Using Vertex-4 Devices", Jan. 5, 2007, pp. 1-12, Xilinx, Inc. 2100 Logic Drive, San Jose, CA 95124.
XAPP 216 (v1.0), "Correcting Single-Event Upsets Through Virtex Partial Configuration", Jun. 1, 2000, pp. 1-12, Xilinx, Inc. 2100 Logic Drive, San Jose, CA 95124.
Xilinx, Inc., "Correcting Single-Event Upsets with a Self-Hosting Configuration Management Core," Mar. 19, 2008, pp. 1-9, XAPP989 (v1.0), available from Xilinx, Inc., 2100 Logic Drive, San Jose, California 95124.

* cited by examiner

*Primary Examiner*—Anh Q Tran
(74) *Attorney, Agent, or Firm*—Justin Liu

(57) ABSTRACT

A method of configuring an integrated circuit having programmable logic including the steps of generating a configuration bitstream in accordance with a configuration setup, storing the configuration bitstream into a portion of a memory, configuring the programmable logic of the integrated circuit with a first configuration portion of the configuration bitstream of the memory, monitoring the integrated circuit for at least one configuration error generated in response to an event upset, reconfiguring at least a portion of the programmable logic of the integrated circuit with a second configuration portion of the configuration bitstream in response to the at least one configuration error generated. The integrated circuit may operate normally during the process of reconfiguring the at least a portion of the programmable logic.

19 Claims, 5 Drawing Sheets

METHOD AND APPARATUS FOR MITIGATING ONE OR MORE EVENT UPSETS

FIELD OF THE INVENTION

The invention relates to integrated circuit devices (ICs). More particularly, the invention relates to correcting a single and multiple event upsets in an IC including programmable logic.

BACKGROUND

Integrated circuits may be susceptible to functional failures under certain conditions. One type of integrated circuit may include integrated circuit having programmable logic, e.g., programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, and so forth.

Well-studied occurrences in circuitry are event upsets which include Single Event Upset (SEU) and Multiple Bits Upset (MBU). SEU and MBU are inadvertent changes in state of a circuit caused by an external energy source such as, cosmic rays, alpha particles, energetic neutrons, and the like. The energetic particles may randomly strike a semiconductor device and penetrate into the substrate (e.g., transistor source and drain regions) of the semiconductor device. These particle strikes create pairs of electrons and holes, which in turn cause undesirable transients that may upset circuit elements, for example, flipping the logic state of a latch or other memory element. As fabrication geometries and supply voltages continue to decrease, SEU and MBU problems become more severe. As a result, efforts to detect and correct effects caused by SEU and MBU are increasingly important.

In an integrated circuit including programmable logic, such as an FPGA, configuration memory defines how the FPGA's resources, e.g., CLBs, IOBs, and interconnect structure, are configured. Inadvertent state changes in the configuration memory resulting from SEU transients may alter the FPGA's operation.

Each programmable tile of an FPGA typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

For all types of integrated circuits including programmable logic, e.g., PLDs, the functionality of the programmable portion of the device is controlled by data bits or bitstream provided to the device for that purpose. The data bits can be stored in volatile memory (e.g., static memory cells, as in FPGAs and some CPLDs), in non-volatile memory (e.g., FLASH memory, as in some CPLDs), or in any other type of memory.

An approach to remedy SEU related issues in configuration memory cells is to use triple modular redundancy (TMR). Utilizing the TMR approach, individual memory cells are replaced with three sets of memory cells, where the outcome of at least two of the three sets controls FPGA operation. However, implementing TMR in an FPGA has an undesirable cost function including an increase in the size and cost of a design in the FPGA. Also, TMR may mitigate a SEU affects, however, MBU and accumulation of SEUs may render the TMR approach ineffective. In general, PLDs are also vulnerable to single event function interrupt. The single function interrupts may affect the operation of the PLD to the point of failure. A method to curb the effects of single event function interrupt includes deploying redundant devices.

Accordingly, it would be desirable to provide a method and apparatus to correct effects caused by SEU and MBU occurrences in an integrated circuit.

SUMMARY

One or more aspects in accordance with the present invention provide method steps of configuring an integrated circuit having programmable logic including the steps of generating a configuration bitstream in accordance with a configuration setup, storing the configuration bitstream into a portion of a memory, configuring the programmable logic of the integrated circuit with a first configuration portion of the configuration bitstream, monitoring the integrated circuit for at least one configuration error generated in response to an event upset, reconfiguring at least a portion of the programmable logic of the integrated circuit with a second configuration portion of the configuration bitstream in response to the one configuration error generated. The integrated circuit operates normally during the process of reconfiguring the at least a portion of the programmable logic.

Another aspect is a system for implementing a design in an integrated circuit including programmable logic capable of monitoring and self correcting configuration of the programmable in response to an event upset, the system provides mean for generating a configuration bitstream in accordance with the monitoring and self correcting features, mean for storing the configuration bitstream into a memory, means for configuring the programmable logic of the integrated circuit with a first configuration portion of the configuration bitstream stored in the memory, means for monitoring the integrated circuit for at least one configuration error generated in response to the event upset, and means for reconfiguring at least a portion of the programmable logic of the integrated circuit with a second configuration portion of the configuration bitstream in response to the at least one configuration error generated. The integrated circuit operates normally during the process of the reconfiguring of the at least a portion of the programmable logic.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough understanding of the present invention. However, it will be apparent to one skilled in the art that the present invention can be practiced without these specific details. In other instances, well known features have not been described in detail, so as not to obscure the invention. For ease of illustration, the same numerical labels may be used in different diagrams to refer to the same items. However, in alternative embodiments the items may be different.

The present invention is applicable to a variety of integrated circuits (ICs). The present invention has been found to be particularly applicable and beneficial for integrated circuits including programmable resources, such as programmable logic devices (PLDs).

Figure 1:
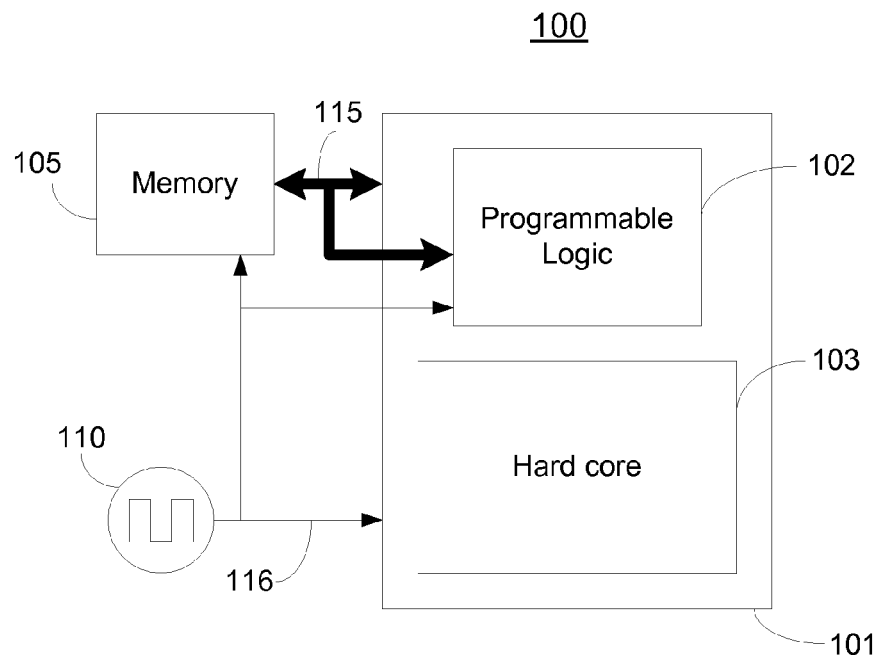
FIG. 1 shows a block diagram of an integrated circuit including programmable logic according to an embodiment of the present invention.

FIG. 1 shows a block diagram of an integrated circuit (IC) including programmable logic according to an embodiment of the present invention. Circuit 100 illustrates an IC 101 including a programmable logic portion 102 and a hard core portion 103. The IC 101 may be configured to perform at least one design function in accordance with a targeted application. The hard core 103 may be a dedicated circuit including one or more application specific designs. For example, the hard core 103 may include a data processor, e.g., IBM Power PC core, a high speed serial input/output core, D/A and A/D converters, and the like. In general, the hard core circuits may only perform functions that they are designed for. The programmable logic portion 102, for example, may include programmable resources or logic having an array of programmable tiles (not shown for simplicity).

These programmable tiles can include, for example, input/output blocks (IOBs), configurable logic blocks (CLBs), dedicated block random access memory blocks (BRAM), multipliers, digital signal processing blocks (DSPs), clock managers, delay lock loops (DLLs), and so forth. Also, each programmable tile typically includes both programmable interconnect and programmable logic. The programmable interconnect typically includes a large number of interconnect lines of varying lengths interconnected by programmable interconnect points (PIPs). The programmable logic may be configured to implement logic function of a user design using programmable elements that can include, for example, function generators, registers, arithmetic logic, and so forth.

The programmable interconnect and the programmable logic are typically programmed by loading a stream of configuration data into internal configuration memory cells that define how the programmable elements are configured. The configuration data can be read from memory (e.g., from an external PROM such as memory 105) or written into the IC 101 by an external device. The collective states of the individual memory cells then determine the function of the programmable logic 102 of the IC 101.

Circuit 100 may also include a clock source 110. As shown in FIG. 1, the clock source 110 may be coupled to the memory 105 and the IC 101 via signal 116. The memory 105 and the clock source 110, for instance, may be implemented as a part of a package incorporated with the IC 101 or implemented as a part of a die including the IC 101. In an example of the present invention, the clock source 110 may provide a clock signal to the memory 105 and a design implemented in the programmable logic 102. The design of the programmable logic and the memory 105 may communicate with one another synchronously to reconfigure at least a portion of the programmable logic, as will be described in more details below with reference to FIGS. 2a and 2b.

Figure 2A:
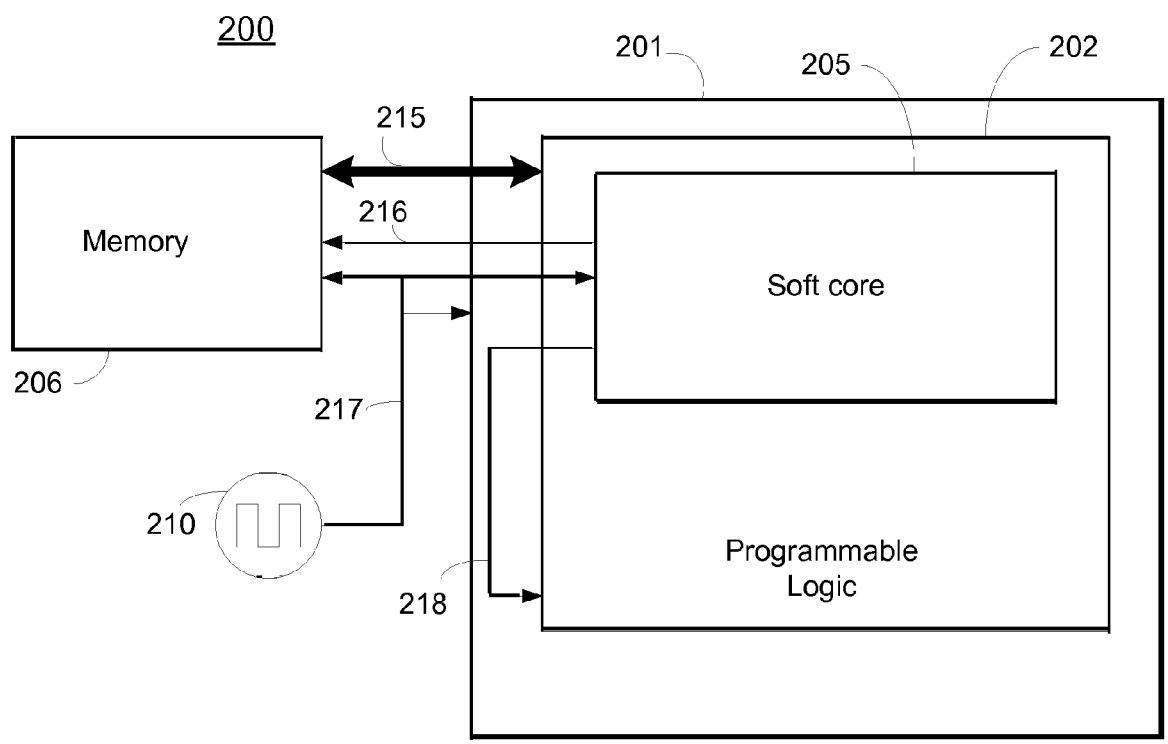
FIG. 2a shows a block diagram of integrated circuit including programmable logic coupled with a memory according to an embodiment of the present invention.

FIG. 2a shows a block diagram of integrated circuit including programmable logic coupled with a memory according to an embodiment of the present invention. Circuit 200 illustrates an IC 201 including programmable logic 202 having a soft core 205 implemented therein. The soft core 205 may include a counter module having an interface coupled with the programmable logic and other elements of block diagram 100, as will be described in details below with reference to FIG. 2a and FIG. 2b. FIG. 2a also shows a memory 206 and a clock source 210, where the clock source may be coupled to the memory 206, the IC 201, and the programmable logic 202. For example, the IC 201 may be implemented to perform a targeted application in a system, e.g., data processing and router application. The system of FIG. 2, for example, may be subjected to an environmental condition that causes the IC 201 to malfunction due to errors induced by an SEU or MBUs. The soft core or block 205 may be implemented to monitor and correct for such events, as will be described in details below.

In FIG. 2a, the clock source 210 may provide a clock output coupled to signal 217 synchronizing communications between at least the memory 206 and the soft core 205 according to an embodiment of the present invention. The memory 206, for example, may be coupled to configure the programmable resources of the programmable logic 202. For instance, upon powering up the system of FIG. 2, a first configuration bitstream or data of the memory 206 may configure the programmable logic 202 to implement at least the soft core 205. For instance, the first configuration data may configure the entire programmable logic including instantiated error detection and error correction cores, and input/output pins that may have dedicated configurations, which may retain their functionality after configuration.

The memory 206 may include a second configuration data. The second configuration data may be a subset of the first configuration data. The second configuration data may be reloaded into the programmable logic in subsequent reconfigurations, as will be described in more detailed below. The second configuration data may also be used to scrub configuration memory of the programmable logic. The second configuration data when reloaded in the configuration memory of the programmable logic may bypass a startup sequence associated with configuring the programmable logic with the first configuration data. The startup sequence is a sequence of events that may take place to wake up configured programmable portion of an integrated circuit. When the startup sequence is completed, a control signal, e.g., DONE signal, may be asserted indicating that the integrated circuit is ready for normal operation. In general, configuring a programmable logic portion of an IC, e.g., block 202, with a configuration bitstream of a memory, e.g., memory 206, is well known process to persons skilled in the art. Also, FIG. 2a shows that the memory 206 and the clock source 210 are external to the IC 201. In some examples, it may be possible to include one or more of the elements shown in FIG. 2a, e.g., the memory 206 and the clock source 210, internal to the IC 201, for example, as stacked die or as part of the IC die.

As described above, circuit 200 may include features that are capable of monitoring and correcting one or more event upsets during which the IC 201 may be operating normally. Event upset(s) may be defined as the alterations of logic state or functional behavior of a design implemented in an IC including static memory elements, such as a latch, flip-flop, random access memory, etc. In general, the programmable logic, e.g., block 202 of the IC 201, depends on data stored in configuration latches of the device. Event upsets such as SEUs and/or MBU may induce errors in the configuration memory array, for example, configuration latches of the programmable logic, causing adverse affects on the expected functionality. Design mitigation techniques, such as triple redundancy, may improve tolerance to errors caused by SEUs and MBU. However, the upsets must be corrected so that errors do not accumulate. In some instances, the accumulation of errors may cause a design implemented in the programmable logic using TMR to fail.

In some instances, a design implemented in an FPGA, e.g., parity checker, may be configured to detect SEUs. For example, one method of detecting an SEU may include the use of readback to detect when an upset has occurred in the configuration memory of the programmable logic. When an error is detected, the data frame that contains the affected bit or bits needs to be corrected. Another method for readback verification and SEU or MBU detection may include the use of cyclic redundancy check (CRC) calculation method. For example, an implemented CRC detection method may record a 32-bit CRC value for each data frame. During readback, a new CRC value may be generated for each data frame that is readback and compared to the expected CRC result. In general, the CRC calculation process takes a string of one character at a time and uses it to modify, for example, a 16 bit or a 32 bit word to be able to generate a unique word that can be duplicated to verify that the string's contents are still intact. Other error detection methods may be used, e.g., checksum method including parity bits, are well know to persons skilled in the art.

Another example of the present invention may include a self-contained and pre-engineered solution, for example the soft core 205, for detection of SEUs and MBU. This solution may include using an internal configuration access port (ICAP) and frame ECC (error correction code) interfaces of an FPGA device, such as a Virtex-4 series device available from Xilinx Inc., San Jose, Calif. The ICAP interface is similar to the SelectMAP configuration interface but is accessible through general interconnect inside the FPGA device, therefore, it does not require any FPGA I/O pins to operate. The frame ECC interface performs an automatic error detection and syndrome generation during configuration data readback using error detection code embedded in the configuration frame of the FPGA.

One or more of the methods described above with reference to error detection may be utilized in conjunction with at least one error correction designs to reconfigure the programmable logic according to an embodiment of the present invention. For instance, a design for detecting errors induced by SEUs and MBU may be implemented in an FPGA. Such design may also include a circuit configured to correct such errors. For example, the counter module 205 implemented in the IC 201 may be configured to receive an error signal from the error detection core described above. The counter module 205, for instance, may also be hardened by way of triplicating the counter design, e.g., utilizing the TMR tool commercially available from Xilinx Inc., San Jose, Calif., making the counter core less sensitive to SEUs and MBU.

The counter module 205 may provide a first control signal 218 coupled to an INIT terminal of the programmable logic 202. The INIT terminal, for example, is an input terminal to the programmable logic 202. Coupled to logic low "0" to the INIT terminal indicates at least one error in the configuration memory of the programmable logic has occurred. Conversely, coupled to logic high "1" to the INIT terminal indicates no errors were reported in the configuration memory of the programmable logic. The counter module 205 may provide a second control signal 216 coupled with the memory 206, where signal 216 controls an output enable or a reset input terminal of the memory 206. In an example, the memory 206 may be coupled with programmable logic 202 of the IC 201 via communication or configuration interface, for example SelectMAP or JTAG (Joint Test Action Group) interfaces (not shown for simplicity). In general, an FPGA's internal cores may control the configuration interface. In another example of the present invention, the counter module 205 may periodically assert the control signals described above to load the second configuration data of the memory 206 configuring at least a portion of the programmable logic to correct one or more possible errors detected due to SEUs or MBU.

The Virtex series FPGA SelectMAP interface provides post-configuration read/write access to the configuration memory array. The Virtex series FPGAs are commercially available form Xilinx Inc., San Jose, Calif. The readback operation is a post-configuration read operation of the configuration memory, and partial reconfiguration operation is a post-configuration write operation to the configuration memory. Readback and partial reconfiguration allow a system to detect and repair at least SEUs and MBU in the configuration memory. The repair or correction operation may be performed without disrupting the IC operations, for example, the IC may operate normally during the reconfiguration process. In other instances, periodically reconfiguring the entire configuration memory of the programmable logic (e.g., scrubbing the configuration memory) may be performed according to an embodiment of the present invention.

For example, CLBs of an FPGA contain all configuration data for all programmable elements within the FPGA. This includes all lookup table (LUT) values, CLB, IOB, and BRAM control elements, and all interconnect control. Therefore, every programmable element within the FPGA may be addressed with a single read or write operation. All configuration latches of the programmable logic may be accessed without any disruption to the functioning user design, as long as LUTs are not used as distributed RAM components.

In general, CLB flip-flops of an FPGA do have programmable features that are selected by configuration latches. The flip-flop registers themselves are separate from configuration latches and cannot be accessed through configuration. Therefore, readback and partial reconfiguration or scrubbing will not affect the data stored in these registers. However, when a LUT is used as either a distributed RAM element, or as a shift register function, configuration latches that normally contain the static LUT values are now dynamic design elements in the user design. Therefore, the use of partial reconfiguration on a design that contains either LUT-RAM (i.e., RAM16X1S) or LUT-Shift-register (SRL16) (not shown for simplicity) components may have a disruptive effect on the user operation.

For this reason the use of these components can not be supported for this type of operation, i.e., partial reconfiguration.

However, storing the programmable logic configuration in the BRAM or in a memory module not associated with the programmable logic may be used in such an application. Since all of the programmable control elements for such memory elements, i.e., the BRAM and the memory module, are contained within the CLBs and the BRAM content is in separate frame segments, partial reconfiguration may be used without disrupting user operation. In other instances, when the LUTs are implemented as distributed RAM or SRL16, readback and scrubbing may not affect the operation of the FPGA as long as the GLUT_MASK is set. The GLUT_MASK is a feature of Virtex-4 and later devices offered by Xilinx Inc., San Jose, Calif. When GLUT_MASK is set, configuration readback and/or scrubbing may bypass the memory elements, thereby not disrupting design elements operation.

In another example, an FPGA may be configured to include the counter module 205 coupled to an error signal when asserted indicates an error in the configuration memory has occurred. The counter module 205 may be triggered by such error signal enabling an auto correction feature of the programmable logic. For instance, a bitstream representing a user design may be generated and stored in a configuration memory (e.g., memory 206). The user design may be manipulated to accommodate both the SEU and MBU with auto error detect feature and the counter module with auto correct feature. Programmable logic, for example, configured by the first bitstream including the features described above may be capable of correcting errors caused by SEU and MBU. In another example, a scrubbing method may be implemented in the programmable logic of an IC to correct for one or more configuration errors detected in the configuration memory of the programmable logic portion of the IC. The scrubbing method or process is a way of loading the second configuration data of the memory 206 into the configuration memory of the programmable logic according to an embodiment of the present invention. The scrubbing process may have less overhead and short cycle time. For example, the cycle time for a complete scrub cycle can be relatively short as the Select-MAP interface is capable of operating at a throughput of approximately 400 Mbits/s. For instance, the scrub cycle may be performed periodically; the chosen interval for the scrub cycle may be based on the expected static upset rate for a given application. A longer cycle interval (e.g., time duration between scrubs) and shorter cycle time (scrub time) may decrease the total percentage of time that the configuration logic is in write mode. In some instances, the scrub cycle interval may be programmable to optimize the performance of the IC.

Figure 2B:
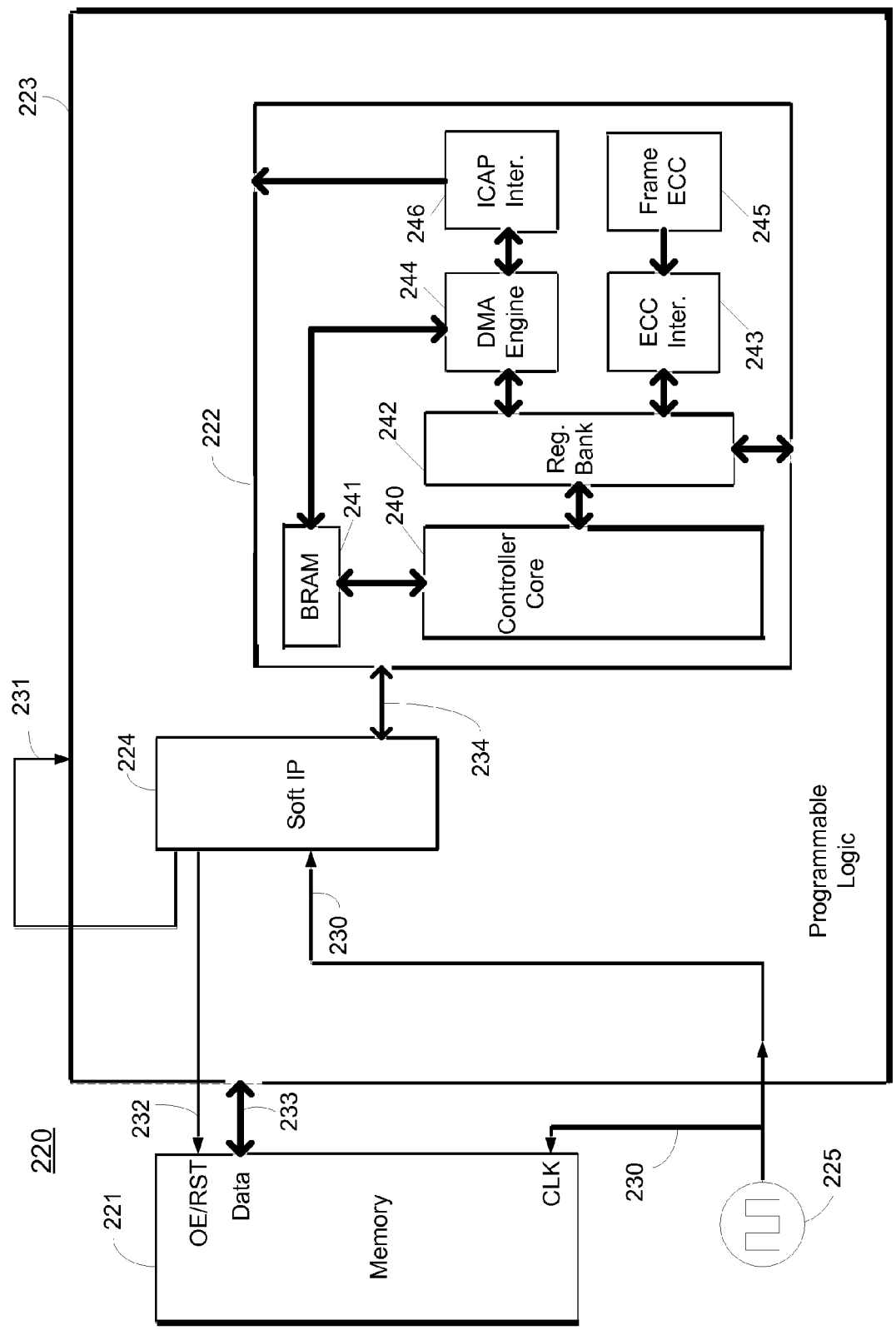
FIG. 2b shows a block diagram of programmable logic including a design coupled with a memory according an embodiment of the present invention.

FIG. 2b is a block diagram of a system including programmable logic configured to detect and correct one or more errors according to an embodiment of the present invention. Circuit 220 may include programmable logic block 223 configured to include, for example, a soft core 224 and SEU error detection core 222. FIG. 2b may also include memory circuit 221 and clock source 225. The clock source may be coupled to both the memory 221 and the soft core 224 to synchronize communications between the two modules. As discussed above, the SEU error detector module 222 may be capable of detecting errors in the configuration memory of the programmable logic and in some instances module 222 may be capable of correcting a single failure or error due to SEU.

In general, The SEU module 222 initiates a readback and monitors the frame ECC interface 243 for detection and also manages the read-modify-write flow required to flip a bit back to its original state when SEU correction is enabled. The BRAM 241 may be required for implementing at least one design core to control the ICAP interface 246 and store configuration frames for correction. The register bank 242 provides an interface between the control core 240 and the rest of the SEU module 222. The interface will allow the controller core 240 to access module inputs and outputs, as well as control the DMA engine 244 that is responsible for managing the flow of configuration data between the BRAM 241 and the ICAP interface 246. The ICAP interface 246 is a hard-wired module that has direct access to the device configuration logic and supports all the normal programmable logic configuration operations (e.g., write, readback, etc.). The register bank 242 also provides control core 240 access to the ECC submodule (not shown for simplicity). The ECC submodule provides an interface to the Frame ECC core 245, a hard-wired core on the IC that calculates an ECC syndrome for each frame of configuration data as it is readback.

Block diagram 220 also illustrates how the various blocks may be coupled to one another. For instance, the soft core 224, which may be associated with an error correction design, is coupled to receive an error detect output via signal 234 from the SEU module 222. The soft core 224, e.g., a counter module, may provide control signals to the programmable logic 223 and the memory 221 via signals 231 and 232 respectively. Signal 231, for example, may control an INIT terminal of the programmable logic 223, and signal 232 may control an output enable or a reset line of the memory 221. Upon power up, the programmable logic may be configured by a first configuration data of the memory 221 via a configuration interface (not shown for simplicity). After the programmable logic is fully configured, the SEU module 222 and counter module 224 may provide control of subsequent configurations of the programmable logic by way of controlling the configuration interface and the memory 221. The subsequent configurations may load a second configuration data including only user design data into the configuration memory of the programmable logic.

Figure 3A:
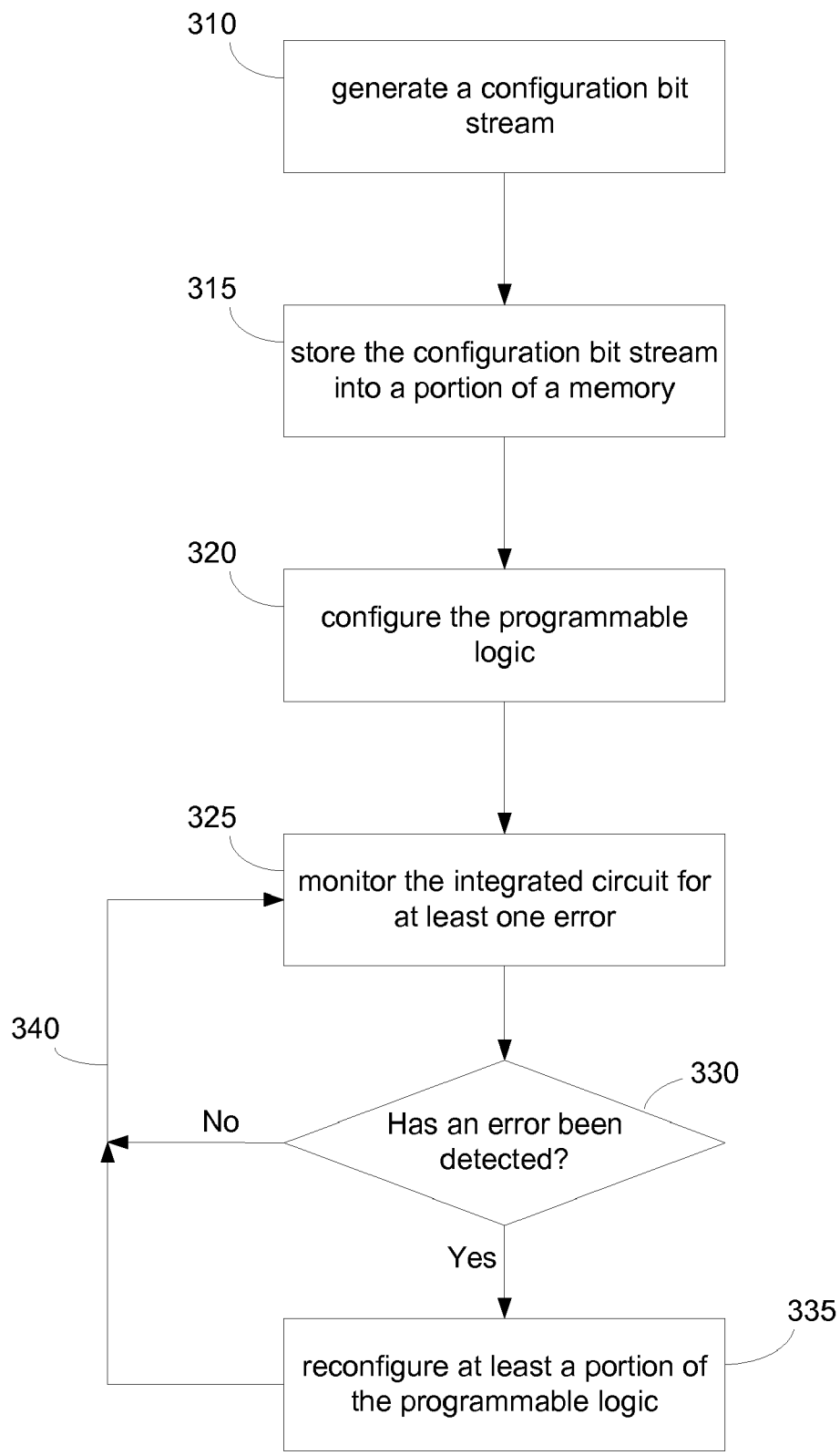
FIG. 3a shows a flow diagram of a method of implementing a self correcting feature in an integrated circuit according to an embodiment of the present invention.

FIG. 3a shows a flow diagram of a method of implementing a self correcting feature in an integrated circuit according to an embodiment of the present invention. At step 310, a configuration bitstream may be generated in accordance with a configuration setup. The configuration setup may manipulate the generated bitstream to include at least one soft core to correct errors in configuration memory according to an embodiment of the present invention. The at least one soft core may be a counter module implemented in programmable logic of the integrated circuit. The counter module of the programmable logic may be coupled to receive an output from a clock source and an output from an error detector module (e.g., SEU error detector), and provide control signals coupled to an output enable of a memory and configuration control terminal of the programmable logic. In another example, the counter module may be triplicated to mitigate SEUs and MBUs effects.

At step 315, the generated bitstream of step 310 may be stored into a portion of a memory. The generated bitstream may include the counter module described above and an SEU and or MBU error detection module according to an embodiment of the present invention. For instance, the generated bitstream may include a first configuration data and a second configuration data. The first configuration data may be uploaded while powering up the device, where the second configuration may be used in partial reconfiguration and scrubbing of configuration memory of the programmable logic according to an embodiment of the present invention. The second configuration data may include only a user design data.

In an example, the error detection module and the counter module may correct one or more errors detected of at least one design implemented in the programmable logic. For instance, SEU or MBU may induce errors in an implemented design of the programmable logic altering the configuration memory of the programmable logic. At step 320, the programmable logic may be configured with the first configuration data of the memory. For example, after powering the integrated circuit a well-known process of configuring the programmable logic may take place. In general configuring a programmable device such as an FPGA is well known to persons skilled in the art. After the programmable logic if fully configured by the first configuration bitstream, the counter module and/or the SEU error detector module may take control of future reconfiguration of the programmable logic.

At step 325, a module of the integrated circuit may monitor the programmable logic for at least one error. For example, the module of the integrated circuit may be the SEU error detector module, where an output of the SEU error detector module may provide a signal indicative of at least one error detected. For instance, the SEU error detector module and the counter module described above may be generated and implemented in the programmable logic as a soft core via configuration interface. In an example, the SEU error detector module may continuously monitor the configuration memory of the programmable logic. For instance, a CRC error checker may be implemented in the SEU error detector to detect one or more errors of the configuration memory. At step 330, if one or more errors are detected by the error detector module, then the implemented error correction module may automatically commence reconfiguration of at least a portion of the programmable logic (step 335). Additionally, the step of reconfiguring the programmable logic (set 335) may be processed without disrupting the operation of the integrated circuit. Conversely, if no errors are detected, then the process of monitoring the integrated circuit may resume (branch back to step 325 via 340).

The step of reconfiguring at least a portion of the programmable logic (e.g., step 335) may include reloading at least a portion of the configuration memory from the memory module having the second configuration data. For instance, when an error is detected the counter module may assert control signals coupled to the memory and the programmable logic. The control signals may initiate the memory to reload at least a portion of the second configuration data into the configuration memory of programmable logic. For instance, a user design affected by one or more errors induced may be reconfigured by restoring the user design from second configuration data stored in the memory. For example, the SEU error detector (of step 310) may detect an error in the user design implemented in the programmable logic. The error correction module including the counter module described above, may provide control signals to the memory and the programmable logic to partially or fully reconfigure the programmable logic. The partial reconfiguration may correct a particular user design of an affected region of the programmable logic. When the reconfiguration of the programmable logic is completed, the monitoring may resume by going back to step 325.

Figure 3B:
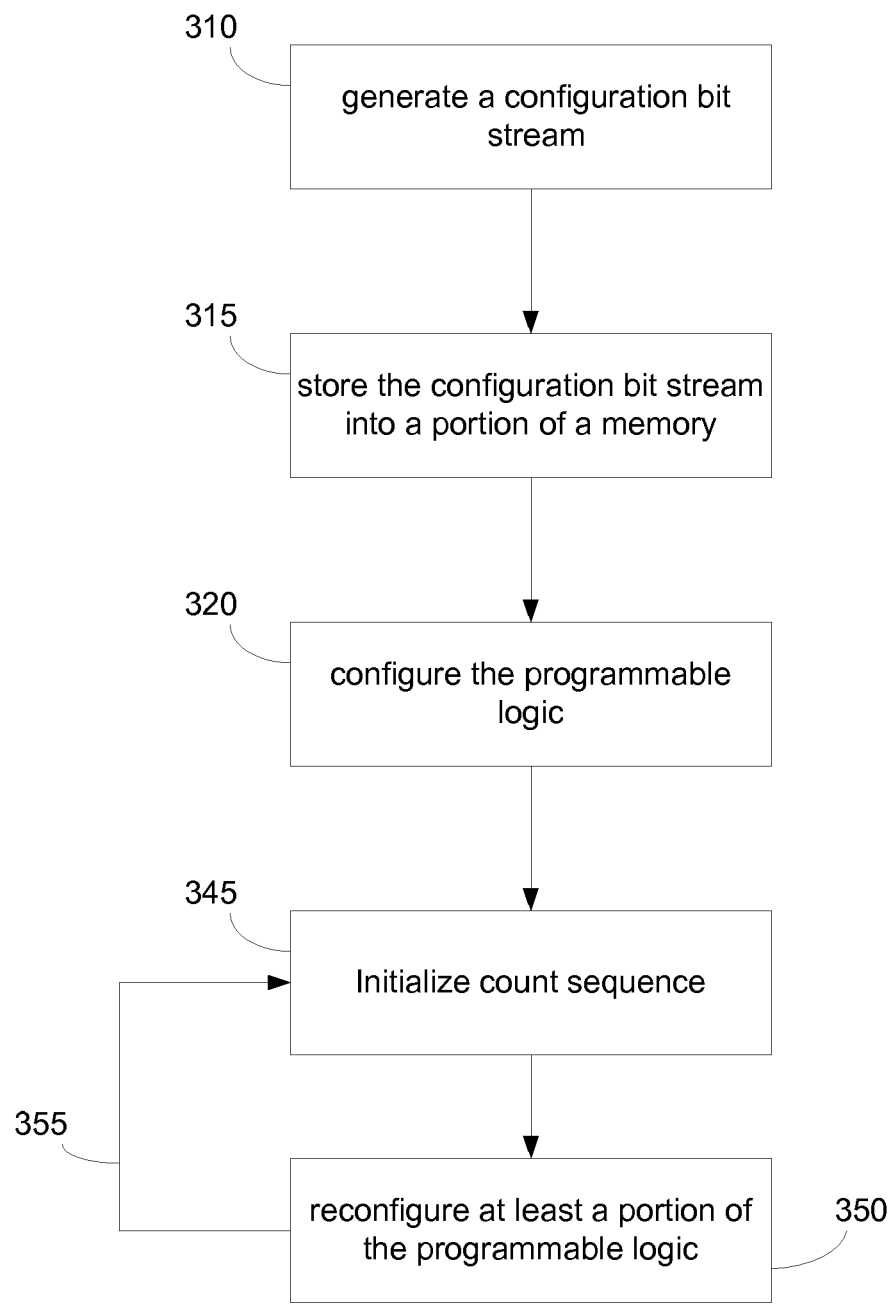
FIG. 3b shows a flow diagram of another method of implementing a self correcting feature in an integrated circuit according to an embodiment of the present invention.

In another example of the present invention, FIG. 3b illustrates another example of a flow diagram of a method of implementing a self correcting feature in an integrated circuit. For instance, the first three steps of the method illustrated in FIG. 3b (steps 310-320) are similar to the first three steps shown and described in FIG. 3a. At step 345, a count sequence may be initialized. For example, the counter module may be triggered in response to signal indicating that the configuration of the programmable logic is completed or done. The counter module may be configured to count to a predetermined value, and when that predetermined value is reached control signals coupled to the programmable logic and the memory may be asserted. At step 350, the control signals generated by the counter module may initiate a scrub cycle, where the programmable logic may be completely reconfigured by way of reloading the configuration memory of the programmable logic and replacing it with the second configuration data of the memory module. When the reconfiguration of the programmable logic is complete, the memory may be reset by a control signal provided by the counter module and another count sequence for the next scrub cycle may be initiated (branch 355).

Figure 4:
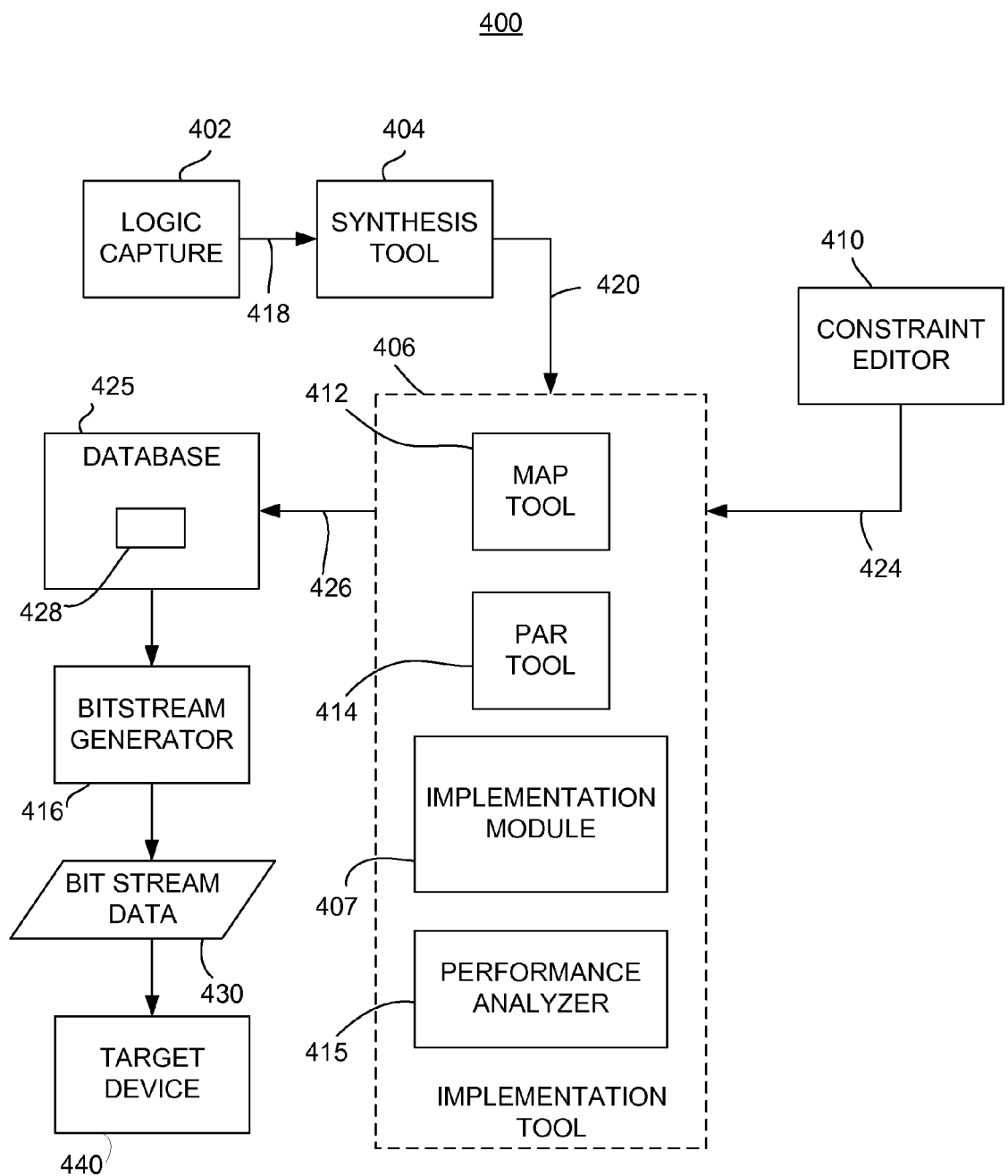
FIG. 4 shows a block diagram of a system for implementing a self correcting feature in a targeted device according to an embodiment of the present invention.

FIG. 4 shows a block diagram of a system for implementing a self correcting feature in a targeted device according to an embodiment of the present invention. The system 400 is adapted to configure a programmable logic portion of an integrated circuit to include a design responsive to at least one error detected due to SEUs and MBU. The design may be implemented in the programmable logic portion and configured to correct errors induced by SEUs and MBU by way of partial reconfiguration or scrubbing the programmable logic. The partial reconfiguration or scrubbing the programmable logic may clear all errors of configuration memory of the programmable logic. For purposes of clarity by example, the logic design system 400 is described immediately below with respect to a logic design in general. Features of the design system 400 specifically pertaining to physical implementation of a circuit design are described thereafter.

The system 400 includes a logic capture tool 402, a synthesis tool 404, a constraint editor 410, an implementation tool 406, and a bitstream generator 416. The system 400 may be configured to provide a circuit design implemented in a targeted device, such as an FPGA. Furthermore, the implementation tool 406 may include a map tool 412, a place-and-route (PAR) tool 414, and a performance analyzer tool 415. The system described in FIG. 4 may be a part of one or more software programs stored in a memory and configured to be executed by a processor.

In general, the logic capture tool 402 is configured to capture a circuit design from a user and generate a behavioral description 418 of the circuit design. The behavioral description 418 may include a plurality of circuit components behavioral description, such as flip-flops, memories, gates, lookup tables (LUTs), and the like, connected together via signal conductors (nets). For example, the behavioral description 418 may include the counter module and the SEU error detector module described above. The logic capture tool 402 may also include a text interface through which a designer writes hardware description language (HDL) code to produce a structural and/or behavioral description of the circuit design in terms of HDL constructs. Examples of HDLs include the very high-speed integrated circuit Hardware Description Language (VHDL) and Verilog.

The synthesis tool 404 is configured to receive the behavioral description 418. The synthesis tool 404 processes the behavioral description 418 to produce a logical description 420 of the circuit design. The logical description 420 includes a logical network list ("netlist") of lower-level circuit elements and logic gates, as well as connections/routes between inputs and outputs thereof, in terms of the hierarchy specified in the behavioral description 418. For example, the logical description 420 may be compliant with the Electronic Design Interchange Format (EDIF). The synthesis tool 404 may also generate constraint data associated with the logical description 420 that includes various timing and layout constraints. Alternatively, the logical description 420 may be annotated with constraint data. Such an annotated netlist may be produced by a synthesis tool, such as the XST synthesis tool commercially available from Xilinx, Inc., of San Jose, Calif.

A designer may use the constraint editor 410 to produce constraint data 424 having various constraints, such as period constraints (e.g., the time between rising edges of a clock signal) for all clocks, as well as input/output (I/O) timing constraints (time between two pins, typically measured from a clock input at a first pin and data out at a second pin) for I/Os, power constraints (e.g., using a range of logic blocks including power saving features), and the like.

The implementation tool 406 is configured to receive the logical description 420 and the constraint data 424. The map tool 412 maps the logical description 420 onto physical resources within the targeted device (i.e., the circuit components, logic gates, and signals are mapped onto flip-flops, clock buffers, gates, I/O pads, and the like of the target programmable logic). The implementation tool 406 produces a mapped circuit description 426 in accordance with any constraints, such as timing constraints, in the constraint data 424. In an example, a circuit design may have at least one timing constraint file. The mapped circuit description 426 includes groupings of the physical resources of the target device 440. For example, the physical resources may be expressed in terms of CLBs and IOBs, and other physical resources an FPGA device, where the FPGA device is the targeted device.

The PAR tool 414 determines placement for the physical resource groupings of the mapped circuit description 426 in the targeted device 440 and allocation of the appropriate routing resources. The PAR tool 414 performs such placement and routing in accordance with any constraints in the constraint data 424. The PAR tool 414 produces a physical design data (e.g., a placed and routed netlist), which is stored in a database 425. The bitstream generator 416 is configured to obtain physical design data from the database 425 and produce bitstream data 430 for the targeted device 440. The bitstream data, for instance, may be stored in a memory, where the targeted device 440 may be coupled with such memory. In general, a route is a physical connection between two or more nodes; we may also refer to the route as a net.

In an embodiment of the present invention, the system 400 may be utilized to generate a behavioral description of a circuit design and corresponding to a user design data. This behavioral description may include at least one design core adapted for monitoring and repairing the design data affected by SEUs and MBU. For example, upon power up the bitstream data 430 may configure the targeted device 440. At least a portion of the bitstream data may reconfigure the programmable portion of the targeted device 440 to implement a design capable of detecting and correcting at least one error in the programmable portion. The at least one error detected may be related to SEUs and MBU.

For instance, when an error in a user design of the programmable portion of the targeted device 440 is detected, another design of the programmable portion may be triggered to reconfigure at least the portion of the affected programmable portion. For example, a counter module may be triggered or initialized to start a count sequence in response to an error detected in the programmable portion. The counter module may assert control signals coupled to the memory storing configuration data or the bitstream data and the programmable logic in response to the end of the count sequence. The count sequence may terminate when a predetermined value is reached, where the predetermined value may be a programmable value. The asserted control signals of counter module may configure the memory and the programmable portion to partially reconfigure the affected design or scrub the entire configuration memory of the programmable portion. In an example of the present invention, an integrated circuit including the programmable portion may be reconfigured while maintaining normal operation. In such instances, the configuration memory of the programmable portion may be reloaded from a memory including user design configuration data stored therein for reconfiguring the programmable portion.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims. For example, the memory 221 of FIG. 2b may be replaced with equivalent circuits such as a register file including a plurality of flip-flop circuits. Further more, the flip-flop circuits may be included in the programmable logic and hardened by triplicating the design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. A method of configuring an integrated circuit including programmable logic, comprising;
   generating a configuration bitstream in accordance with a configuration setup;
   storing the configuration bitstream into a portion of a memory;
   configuring the programmable logic of the integrated circuit with a first configuration portion of the configuration bitstream of the memory;
   monitoring the integrated circuit for at least one configuration error generated in response to an event upset; and
   reconfiguring at least a portion of the programmable logic of the integrated circuit with a second configuration portion of the configuration bitstream of the memory in response to the at least one configuration error generated,
   wherein the integrated circuit operates normally during the reconfiguration of the at least a portion of the programmable logic.

2. The method of claim 1, wherein the second configuration portion is a subset of the first configuration portion, and
   wherein the second configuration portion includes a user design implemented in the programmable logic of the integrated circuit.

3. The method of claim 2, further comprising implementing an error detector core capable of detecting the at least one configuration error,
   wherein the error detector core is a part of the first configuration portion.

4. The method of claim 3, wherein the step of reconfiguring the programmable logic comprises:
   triggering a design implemented in the programmable logic to initialize a count sequence; and disabling the reconfiguration of the programmable logic of the integrated circuit when the count sequence reaches a predetermined value, wherein the predetermined value is programmable.

5. The method of claim 4, wherein the step of triggering the design is responsive to the at least one configuration error generated.

6. The method of claim 4, wherein the step of triggering the design is responsive to a signal indicating the step of configuring the programmable logic is completed.

7. The method of claim 4, further comprising:
coupling the memory and the design in the programmable logic via a communication interface;
synchronizing the memory and the design in the programmable logic; and
resetting the memory in response to the completion of the step of reconfiguring at least a portion of the programmable logic.

8. The method of claim 4, wherein the design implemented in the programmable logic is triplicated to mitigate the effect of the event upset.

9. The method of claim 2, further comprising:
generating a configuration done signal in response to completion the step of configuring the programmable logic;
counting a sequence initialized by the configuration done signal generated;
scrubbing the programmable logic when a predetermined value in the sequence is reached; and
resetting the memory in response to the step of scrubbing,
wherein the step of scrubbing reloads configuration memory of the programmable logic with the second configuration portion.

10. A system for implementing a design in an integrated circuit including programmable logic capable of monitoring and self correcting configuration of the programmable logic in response to an event upset, the system comprising:
means for generating a configuration bitstream in accordance with the monitoring and self correcting features;
means for storing the configuration bitstream into a memory;
means for configuring the programmable logic of the integrated circuit with a first configuration portion of the configuration bitstream stored in the memory;
means for monitoring the integrated circuit for at least one configuration error generated in response to the event upset; and
means for reconfiguring at least a portion of the programmable logic of the integrated circuit with a second configuration portion of the configuration bitstream in response to the at least one configuration error generated,
wherein the integrated circuit operates normally during the process of the reconfiguration of the at least a portion of the programmable logic.

11. The method of claim 10, wherein the second configuration portion is a subset of the first configuration portion, and wherein the second configuration portion includes user design implemented in the programmable logic of the integrated circuit.

12. The system of claim 11, further comprising implementing an error detector core capable of detecting the at least one configuration error,
wherein the error detector core is responsive to the event upset, and
wherein the event upset is a part of the first configuration portion.

13. The system of claim 12, wherein the means for reconfiguring the programmable logic comprises:
means for triggering a design configured in the programmable logic to initialize a count sequence; and
means for disabling the configuration of the programmable logic when the count sequence reaches a predetermined value,
wherein the predetermined value is programmable.

14. The system of claim 13, wherein the means for triggering the design is responsive to the at least one configuration error generated by the programmable logic.

15. The system of claim 12, wherein the means for triggering the design is responsive to a signal generated by the integrated circuit, and
wherein the single generated indicates a completion of the means for configuring the programmable logic.

16. The system of claim 13, further comprising:
means for coupling the memory and the design in the programmable logic;
means for synchronizing operations between the memory and the design in the programmable logic; and
means for resetting the memory in response to completing the means for reconfiguring at least a portion of the programmable logic.

17. The system of claim 16, wherein the means for coupling the memory and the design comprises implementing a communication interface between the memory and the design,
wherein the communication interface is a joint test action group communication protocol.

18. The system of claim 14, wherein the design implemented in the programmable logic is triplicated.

19. The system of claim 11, further comprising:
means for generating a configuration done signal in response to completing the means for configuring the programmable logic;
means for counting a sequence initialized by the means for configuration done signal generated;
means for scrubbing the programmable logic of the integrated circuit when a predetermined value in the sequence is reached; and
means for resetting the memory in response to the means for scrubbing,
wherein the means for scrubbing reconfigures the programmable logic with the second configuration portion.

* * * * *